(12) United States Patent
Oda et al.

(10) Patent No.: US 8,425,696 B2
(45) Date of Patent: Apr. 23, 2013

(54) SPUTTERING TARGET

(75) Inventors: Kunihiro Oda, Ibaraki (JP); Atsushi Fukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 960 days.

(21) Appl. No.: 12/088,793

(22) PCT Filed: Sep. 7, 2006

(86) PCT No.: PCT/JP2006/317729
§ 371 (c)(1),
(2), (4) Date: Mar. 31, 2008

(87) PCT Pub. No.: WO2007/040014
PCT Pub. Date: Apr. 12, 2007

(65) Prior Publication Data
US 2009/0134021 A1 May 28, 2009

(30) Foreign Application Priority Data
Oct. 4, 2005 (JP) ................. 2005-290894

(51) Int. Cl.
*C22C 27/02* (2006.01)
*C23C 14/14* (2006.01)

(52) U.S. Cl.
USPC .................. 148/422; 204/298.12

(58) Field of Classification Search .......... 148/422
See application file for complete search history.

(56) References Cited

U.S. PATENT DOCUMENTS

| | | |
|---|---|---|
| 4,994,118 A | 2/1991 | Pircher et al. |
| 6,153,315 A | 11/2000 | Yamakoshi et al. |
| 6,193,821 B1 | 2/2001 | Zhang |
| 6,197,134 B1 | 3/2001 | Kanzaki et al. |
| 6,323,055 B1 | 11/2001 | Rosenberg et al. |
| 6,331,233 B1 | 12/2001 | Turner |
| 6,348,113 B1 | 2/2002 | Michaluk et al. |
| 6,348,139 B1 | 2/2002 | Shah et al. |
| 6,759,143 B2 | 7/2004 | Oda et al. |
| 6,761,982 B2 * | 7/2004 | Sakawaki et al. .......... 428/831.2 |
| 6,770,154 B2 | 8/2004 | Koenigsmann et al. |
| 6,893,513 B2 | 5/2005 | Michaluk et al. |
| 7,156,963 B2 | 1/2007 | Oda |
| 2002/0063056 A1 | 5/2002 | Shah et al. |
| 2005/0029094 A1 | 2/2005 | Watanabe et al. |
| 2005/0268999 A1 | 12/2005 | Oda |
| 2007/0023281 A1 | 2/2007 | Oda |
| 2007/0062806 A1 | 3/2007 | Oda |
| 2007/0062807 A1 | 3/2007 | Oda |
| 2007/0102288 A1 | 5/2007 | Oda et al. |
| 2009/0032392 A1 | 2/2009 | Miyashita |

FOREIGN PATENT DOCUMENTS

EP 0902102 A1 3/1999

OTHER PUBLICATIONS

English Abstract of JP 2001-271161 A, Oct. 2, 2001.
English Abstract of JP 2000-323433 A, Nov. 24, 2000.
English Abstract of JP 2000-239835 A, Sep. 5, 2000.
English Abstract of JP 2002-363736 A, Dec. 18, 2002.
English Abstract of JP 09-104972 A, Apr. 22, 1997.
English Abstract of JP 61-124566 A, Jun. 12, 1986.
English Abstract of JP 06-264232 A, Sep. 20, 1994.
English Abstract of JP 2000-323434 A, Nov. 24, 2000.
English Abstract of JP 2004-027358 A, Jan. 29, 2004.
English Abstract of JP 01-215426 A, Aug. 29, 1989.
Michaluk et al., "Tantalum 101: Economics and Technology of Ta Materials", Semiconductor International, pp. 271-278, Jul. 2000.
esp@cenet database, One Page English Abstract of JP 2002-363736 A1, Dec. 18, 2002.
esp@cenet database, One Page English Abstract of JP 2001-316808 A1, Nov. 16, 2001.
esp@cenet database, One Page English Abstract of JP 03-257158 A1, Nov. 15, 1991.

* cited by examiner

*Primary Examiner* — George Wyszomierski
(74) *Attorney, Agent, or Firm* — Howson & Howson LLP

(57) ABSTRACT

Provided is a tantalum or a tantalum alloy target capable of shortening the burn-in time and minimizing the fluctuation in the deposition speed throughout the target life, whereby the production efficiency of semiconductors in the sputtering process can be improved and stabilized, and the production cost can be significantly reduced. With tantalum or tantalum-based alloy sputtering target, provided is a sputtering target, wherein FWHM (full width of half maximum) of a {200} crystal plane measured by X-ray diffraction of the sputtered outermost surface is 0.1 to 0.6°, and wherein the variation of FWHM is within ±0.05°.

16 Claims, No Drawings

SPUTTERING TARGET

BACKGROUND OF THE INVENTION

The present invention relates to a sputtering target capable of shortening the burn-in time and performing deposition on a wafer or a substrate at a stable speed during sputtering.

Heretofore, the reduction of particles and improvement of uniformity (uniformization of the film thickness and film resistance) were sought by controlling the crystal grain size and crystalline orientation of high-purity tantalum materials in a tantalum sputtering target. Examples of this are described below.

For instance, proposed is technology of providing a tantalum sputtering target, wherein the average crystal grain size is 0.1 to 300 μm, variation of the average crystal grain size according to location is within ±20%, the oxygen concentration is 50 ppm or less, and, with respect to the impurity concentration, Na≦0.1 ppm, K≦0.1 ppm, U≦1 ppb, Th≦1 ppb, Fe≦5 ppm, Cr≦5 ppm, Ni≦5 ppm, and the total content of high-melting metal elements (Hf, Nb, Mo, W, Ti and Zr) is 50 ppm or less. This tantalum sputtering target is able to improve the deposition speed by selectively increasing the plane orientation of {110}, {200} and {211} having a high atom density as the sputtering surface, and improve the uniformity by inhibiting the variation of the plane orientation (Patent Document 1).

Further, proposed is a tantalum sputtering target comprising a crystal structure in which the (222) orientation was preferential from a position of 30% of the target thickness toward the center plane of the target for improving the uniformity throughout the sputtering life (Patent Document 2).

Patent Document 3 proposes a metal product and a sputtering target comprising at least substantially 99.95 wt % of tantalum and a (100) cubic texture of that the surface is substantially uniform, and having a maximum grain size of 50 microns or less. This technology is useful as a metal product having a fine and uniform texture, particularly as a sputtering target.

Further, in order to reduce the particles in the initial stage of sputtering and obtain a uniform film (uniformity), it is important to reduce the surface roughness and eliminate a work-affected layer (residual stress layer) on the surface of the sputtering target. An example of this is shown in Patent Document 4.

Patent Document 4 describes that it is possible to reduce the generation of particles by substantially eliminating the machining defect layer (crushed layer) resulting from minute cracks and missing portions generated during the machining process at least on the surface portion of a sputtering target for a high-melting metal alloy. In order to realize this, Patent Document 4 describes that it is important to refine the finish surface roughness (Ra of 0.5 μm or less), and give consideration to reducing the working steps in relation to the distribution of material defects in order to substantially eliminate the machining defect layer with cracks and dropout holes.

The surface treatment method reduces the abrasive grains and refines the finish surface roughness through the steps of lapping, polishing and mechano-chemical polishing, and thereby reduces the residual stress caused by grinding.

Further, Patent Document 5 describes a sputtering target, wherein the surface roughness (Ra is 1.0 μm or less), the total content of Si, Al, Co, Ni, B and high-melting metal elements excluding the primary components and alloy components as contaminants is 500 ppm or less, the hydrogen content on the surface is 50 ppm or less, and the thickness of the work-affected layer is 50 μm or less. Patent Document 5 further describes that, when necessary, the target is manufactured by precision cutting with a diamond tool.

As described above, cutting work (in particular, diamond finishing-cut) and polishing processing (wet polishing or chemical processing) are performed in manufacturing a sputtering target, and it may be difficult to prevent the generation of nodules even if the surface roughness is adjusted when high deformation is performed. This is assumed to be because when high deformation is performed, the atomic arrangement is disturbed and the angle of the particles discharged during sputtering becomes lower, and even if the surface roughness is low, namely, even if the asperity of the surface is small, it eases adherence of particles to the surface. Thus, it was necessary to keep the thickness of the work-affected layer of the surface 50 μm or less.

If high deformation is performed so that the thickness of the work-affected layer exceeds 50 μm, it is not possible to effectively reduce the number of nodules and particles.

This technology itself is effective. Nevertheless, it requires an extremely long time to completely eliminate the work-affected layer (residual stress layer) of the target surface, and there are problems in low productivity and a waste of materials through cutting and grinding the target thickly.

Further, it is difficult to uniformly polish a large area (for instance, up to around φ450 mm) of a target or the like by chemical polishing such as etching, and the surface gloss often deteriorates by selectively etching the crystal grain boundary. In particular, tantalum having high chemical resistance must be polished with powerful hydrofluoric acid or sulfuric acid, and there is a problem in that the removal of the residual liquid is difficult.

In the sputtering process, a conditioning process referred to as a burn-in is performed while subjecting a dummy wafer to a flow until the initial deposition becomes stable. As with this burn-in process, proposals have been made to perform reverse sputtering after the final processing of the target in order to eliminate the work-affected layer so as to shorten the burn-in time when the target is used in the actual deposition process.

Nevertheless, these various methods require the same level of equipment as a sputtering device for manufacturing semiconductors. Moreover, in these methods, the burn-in time is merely shifted to the target manufacturing process and it does not provide the comprehensive solution for shortening the overall processing time.

[Patent Document 1] Japanese Patent Laid-Open Publication No. H11-080942
[Patent Document 2] Japanese Patent Laid-Open Publication No. 2004-107758
[Patent Document 3] National Publication of Translated Version 2002-518593
[Patent Document 4] Japanese Patent Laid-Open Publication No. H3-257158
[Patent Document 5] Japanese Patent Laid-Open Publication No. H11-1766

SUMMARY OF THE INVENTION

Thus, an object of the present invention is to provide a tantalum or a tantalum-based alloy target capable of shortening the burn-in time of a sputtering target and minimizing the fluctuation in the deposition speed throughout the target life, whereby the production efficiency of semiconductors in the sputtering process can be improved and stabilized, and the production cost can be reduced.

In order to achieve the foregoing object, as a result of intense study concerning the influence that the various target materials has on the deposition speed, it was found that the amount of processing strain expressed by FWHM (full width of half maximum) of {200} X-ray diffraction peak, which is obtained with the outermost surface (initial unsputtered surface) of a Ta sputtering target, significantly affects the burn-in time and the fluctuation in the subsequent deposition speed.

Based on the foregoing discovery, the present invention provides: 1) A tantalum or a tantalum-based alloy sputtering target, wherein FWHM of a {200} crystal plane measured by X-ray diffraction of the sputtered outermost surface is 0.1 to 0.6°. It enables to significantly shorten the burn-in time and inhibit changes in the subsequent deposition speed.

The foregoing conditions are the optimal conditions for achieving the present invention, which aims at significantly shortening the burn-in time and inhibiting changes in the subsequent deposition speed. Although there are preferable processing and heat treatment conditions for achieving these conditions, such conditions can be selected arbitrarily, and it should be understood that there is no reason for the present invention to be bound by these conditions. Further, as shown below, there are additional preferable conditions. Each of these preferable conditions is in itself a novel invention and is an improvement of the foregoing invention, and it should be understood that these additional preferable conditions do not limit the scope of the invention described in paragraph 1) above.

2) The sputtering target according to paragraph 1) above, wherein FWHM is 0.15 to 0.45°. More preferable results can be obtained when FWHM is within the foregoing range.

3) The sputtering target according to paragraph 1) or paragraph 2) above, wherein the variation of FWHM is within ±0.05°. It is desirable to keep the variation of FWHM as small as possible, and the fluctuation in the deposition speed can thereby be effectively inhibited.

4) The sputtering target according to any one of paragraphs 1) to 3) above, wherein FWHM of a {110} crystal plane is 0.25 to 0.4°, and the variation of FWHM is within ±0.05°. By adjusting FWHM of the {110} crystal plane, it is possible to further improve the effect of the present invention.

5) The sputtering target according to any one of paragraphs 1) to 4) above, wherein the depth of the processing strain of the tantalum or tantalum-based alloy sputtering target is a depth of 15 μm from the target surface; and 6) The sputtering target according to paragraph 5) above, wherein the depth of the processing strain of the tantalum or tantalum-based alloy sputtering target is a depth of 10 μm from the target surface.

The present invention yields superior effects of significantly reducing the initial burn-in time of a tantalum or a tantalum-based alloy sputtering target and minimizing the fluctuation in the deposition speed throughout the target life, whereby the production efficiency of semiconductors in the sputtering process can be improved and stabilized, and the production cost can be significantly reduced.

DETAILED DESCRIPTION OF THE INVENTION

The present invention is now explained in detail below.

FWHM (full width of half maximum) of a crystal plane measured by X-ray diffraction of the target only represents the internal stress contained in such crystal plane, and this results from the deformation processing such as forging or rolling during the target manufacture and the processing strain during the machining process such as when cutting the target.

The larger FWHM, the larger the residual strain. Thus, a target has conventionally been manufactured so that residual strain formed on the surface can be reduced as much as possible by alleviating residual strain, which results from molding of the target shape through forging or rolling and texture control for refining and uniformizing the crystal grain size, with heat treatment, and by subjecting the target surface to precision machining.

The crystal structure of tantalum, as with vanadium, niobium, molybdenum, tungsten and the like, is of a body-centered cubicle (BCC) structure. Nevertheless, particularly with high-purity tantalum of 3N5 to 6N, since it is a soft material unlike tungsten, it is easy to perform deformation processing such as forging and rolling in a non-oxygenated atmosphere.

Like this, since it is possible to control the crystalline orientation through deformation processing, targets with various orientations have been proposed.

With a BCC structure having few equivalent crystal planes, even an inclination of a minor eroded surface will become a significant fluctuation as the plane orientation, and it is considered that the internal strain of the crystal plane will be largely affected.

For instance, Japanese Patent Laid-Open Publication No. 2003-49264 proposes a tungsten target wherein FWHM of the peak of the crystal plane {110} that is a close-packed plane obtained by X-ray diffraction in order to improve the uniformity of the tungsten film and reduce the generation of particles is 0.35 or less.

Nevertheless, unlike this kind of tungsten target, in the case of a tantalum or a tantalum-based alloy, since the plastic deformation capacity is high as described above and rotation of the crystal plane will occur, FWHM of the close-packed plane {110} will not exert much influence, and it has been discovered that rather the half-width value of the {200} plane exerts significant influence.

Conventionally, processing strain on the surface was eliminated by performing pre-sputtering known as burn-in in the initial stage. Nevertheless, since conventional burn-in required much time, it caused the sputtering efficiency to deteriorate. This is because a method of adequately evaluating the processing strain of the target has not been established, and consequently a specific method of constantly reducing the processing strain of the target has not been established.

As described above, variation in FWHM of the crystal plane {200} of a tantalum or a tantalum-based alloy is caused by deformation processing such as forging and rolling and processing strain resulting from machining of the surface.

Therefore, it has been discovered that it is possible to reduce the processing strain of the target and shorten the burn-in time by appropriately controlling FWHM by reference to FWHM of the crystal plane {200} as an index, and further minimize the fluctuation in the deposition speed. This was conventionally unthinkable.

In order to stably control FWHM of the {200} plane of a tantalum or a tantalum-based alloy, it has been discovered that performing heat treatment at a relatively low temperature in a vacuum is especially effective.

The reason FWHM of the {200} plane was made to be 0.1 to 0.6° (preferably 0.15 to 0.45°) is because there is a problem in that the processing strain will become significant when FWHM exceeds 0.6°. This will affect and deteriorate the uniformity of the sputtered film. In order to improve the uniformity, there is a problem in that the burn-in must be performed for a long period of time when the processing strain is concentrated on the surface.

Tantalum is used as a barrier film by forming a tantalum nitride film through reactive sputtering, and inferior film uniformity is considered to increase the residual stress (film stress) in the nitride film and must be avoided.

Contrarily, if FWHM is less than 0.1°, the redeposition film will peel easily and increase the generation of particles when a film (redeposition film) to be reattached to the target is formed. Further, when FWHM is less than 0.1°, processing will become extremely difficult, and this is not realistic since an enormous amount of time will be required for the processing of finishing and the like.

Therefore, it is evident that controlling FWHM of the {200} plane of a tantalum or a tantalum-based alloy to be 0.1 to 0.6° (preferably 0.15 to 0.45°) is effective in reducing the burn-in time in the initial stage, minimizing the fluctuation in the deposition speed throughout the target life, and facilitating the processing of the target.

EXAMPLES

Examples and Comparative Examples of the present invention are now explained. Incidentally, these examples are merely illustrative, and the present invention shall in no way be limited thereby. In other words, the present invention shall include the various modes and modifications covered by the technical spirit of this invention.

Examples 1 to 16

An EB molten tantalum ingot (φ190×60 mmh) having a purity level of 4N5 was subject to deformation processing and heat treatment and used as the raw material. Foremost, the ingot was subject to cold tightening forging up to φ100×100 mmh, and thereafter subject to upset forging up to φ160×xt.

After performing heat treatment for 2 hours at 1000 to 1200° C., cold rolling was performed up to a thickness of 10 mm. The degree of rolling processing is as per Table 1.

Further, the degree of rolling processing was adjusted according to the thickness of the preform during upset forging. After cold rolling, heat treatment was performed at a low temperature of 250° C. or less in Example 1 to Example 5. In particular, heat treatment was performed in a temperature range of 100 to 200° C. in Example 1 to Example 4, and at a temperature of 250° C. in Example 5. Vacuum heat treatment was not performed at a low temperature in Example 6 to Example 16. Table 1 shows a list of conditions of the heat treatment temperature. The obtained samples were diffusion-bonded to a copper alloy backing plate, and thereafter machined into a target shape.

As the surface machining method, lathe was used for crude processing, precision lathe was used for cutting work, and wet polishing was performed thereafter to inhibit the formation of a work-affected layer as much as possible. Specifically, after forming a target surface to a certain degree with crude processing, the target was cut with a precision lathe to a depth of 100 µm.

Since it has become known that the work-affected layer resulting from this cutting was roughly ½ to ⅓ of the cut amount, the work-affected layer was cut with a precision lathe or diamond cutter at a depth of 50 µm in order to eliminate this work-affected layer. The work-affected layer that was newly formed as a result of this cutting process was 25 µm or less. Cutting was further performed at a depth of 25 µm. The work-affected layer that was formed as a result of this cutting process was 15 µm or less. Like this, since it is difficult to further eliminate the work-affected layer merely by repeating lathe processing, wet polishing was subsequently performed. It was thereby possible to stably form a preferable work-affected layer of 10 µm or less.

The target surface roughness was uniformized so that the center-line surface roughness Ra will be roughly 0.2 to 0.3 µm (in reality, Ra 0.16 to 0.33 µm) for the sake of comparison. Further, vacuum heat treatment was performed at a low temperature to certain samples. Before sputtering, XRD measurement was conducted on a plane that is parallel with the target sputtered face at 9 locations in a cross shape. The burn-in time was calculated as the time (integral power) until the deposition speed stabilized.

The XRD measurement conditions are as follows.
X-ray generator: 3 kW
Radiation source: Cu
Wavelength: 1.54056 angstrom
Tube voltage: 40.0 kV
Tube current: 30.0 mA
Scan speed: 15.000 deg/min
Sampling interval: 0.020 deg
Scan axis: 2θ/θ

The target thus obtained was sputtered at a sputtering power of 30 kW. The results are shown in Table 1.

TABLE 1

| | No. | Degree of Rolling Processing (%) | Heat Treatment Temperature (° C.) | Target Processing | Vacuum Heat Treatment (° C.) | FWHM of Surface (200) | FWHM Variation of Surface (200) | FWHM of Surface (110) | FWHM Variation of Surface (110) | Work-Affected Layer (Approx. µm) | Burn-in (kWh) | Particles |
|---|---|---|---|---|---|---|---|---|---|---|---|---|
| Examples | 1 | 80 | 1000 | Lathe, Precision Lathe, Wet Grinding | 100 | 0.41 | ±0.03 | 0.30 | ±0.07 | 8 | 38 | Few |
| | 2 | 75 | 1050 | Lathe, Precision Lathe, Wet Grinding | 125 | 0.45 | ±0.03 | 0.35 | ±0.03 | 7 | 28 | Few |
| | 3 | 90 | 1000 | Lathe, Precision Lathe, Wet Grinding | 150 | 0.34 | ±0.03 | 0.30 | ±0.03 | 5 | 30 | Few |
| | 4 | 65 | 1050 | Lathe, Precision Lathe, Wet Grinding | 200 | 0.31 | ±0.03 | 0.30 | ±0.03 | 5 | 32 | Few |
| | 5 | 70 | 1100 | Lathe, Precision Lathe, Wet Grinding | 250 | 0.22 | ±0.04 | 0.21 | ±0.02 | 8 | 55 | Normal |
| | 6 | 70 | 1050 | Lathe, Precision Lathe, Wet Grinding | — | 0.12 | ±0.03 | 0.25 | ±0.02 | 5 | 60 | Normal |
| | 7 | 75 | 1050 | Lathe, Precision Lathe, Wet Grinding | — | 0.15 | ±0.03 | 0.25 | ±0.02 | 5 | 25 | Few |
| | 8 | 75 | 1200 | Lathe, Precision Lathe, Wet Grinding | — | 0.35 | ±0.03 | 0.30 | ±0.04 | 10 | 30 | Few |
| | 9 | 85 | 1150 | Lathe, Precision Lathe, Wet Grinding | — | 0.31 | ±0.03 | 0.30 | ±0.03 | 10 | 33 | Few |
| | 10 | 70 | 1200 | Lathe, Precision Lathe, | — | 0.45 | ±0.03 | 0.42 | ±0.06 | 10 | 38 | Few |

TABLE 1-continued

|  | No. | Degree of Rolling Processing (%) | Heat Treatment Temperature (° C.) | Target Processing | Vacuum Heat Treatment (° C.) | FWHM of Surface (200) | FWHM Variation of Surface (200) | FWHM of Surface (110) | FWHM Variation of Surface (110) | Work-Affected Layer (Approx. μm) | Burn-in (kWh) | Particles |
|---|---|---|---|---|---|---|---|---|---|---|---|---|
|  | 11 | 85 | 1150 | Lathe, Precision Lathe, Wet Grinding | — | 0.30 | ±0.08 | 0.30 | ±0.04 | 12 | 45 | Few |
|  | 12 | 70 | 1200 | Lathe, Precision Lathe, Wet Grinding | — | 0.43 | ±0.07 | 0.35 | ±1.00 | 13 | 45 | Normal |
|  | 13 | 75 | 1050 | Lathe, Precision Lathe | — | 0.44 | ±0.09 | 0.43 | ±1.02 | 17 | 59 | Few |
|  | 14 | 89 | 1100 | Lathe, Precision Lathe, Wet Grinding | — | 0.55 | ±0.04 | 0.45 | ±0.06 | 17 | 75 | Few |
|  | 15 | 92 | 1150 | Lathe, Precision Lathe, Wet Grinding | — | 0.46 | ±0.03 | 0.29 | ±0.06 | 18 | 80 | Few |
|  | 16 | 80 | 1000 | Lathe, Precision Lathe | — | 0.53 | ±0.08 | 0.42 | ±0.04 | 18 | 70 | Few |
| Comparative Examples | 1 | 80 | 850 | Lathe, Precision Lathe, Wet Grinding | — | 0.91 | ±0.05 | 0.96 | ±0.04 | 25 | 180 | Normal |
|  | 2 | 75 | 1300 | Lathe, Precision Lathe, Wet Grinding | — | 0.78 | ±1.01 | 0.81 | ±0.95 | 20 | 170 | Normal |
|  | 3 | 80 | 1000 | Lathe, Precision Lathe, Wet Grinding | 800 | 0.07 | ±0.03 | 0.17 | ±0.03 | 5 | 55 | Many |
|  | 4 | 80 | 1000 | Lathe, Precision Lathe, Etching | — | 0.08 | ±0.12 | 0.31 | ±0.09 | 8 | 60 | Many |
|  | 5 | 89 | 1100 | Lathe, Precision Lathe | — | 0.75 | ±0.08 | 0.35 | ±0.07 | 18 | 130 | Many |
|  | 6 | 92 | 1150 | Lathe, Precision Lathe | — | 0.65 | ±0.03 | 0.40 | ±0.05 | 17 | 120 | Normal |

—: No Vacuum Heat Treatment

Comparative Examples 1 to 6

As with the Examples, an EB molten tantalum ingot (φ190×60 mmh) having a purity level of 4N5 was subject to deformation processing and heat treatment and used as the raw material. Foremost, the ingot was subject to cold tightening forging up to φ100×100 mmh, and thereafter subject to upset forging up to φ160×xt.

After performing heat treatment for 2 hours at 850 to 1300° C., cold rolling was performed up to a thickness of 10 mm. The degree of rolling processing is as per Table 1.

Further, the degree of rolling processing was adjusted according to the thickness of the preform during upset forging. As shown in Table 1, heat treatment was performed at a high temperature of 800° C. after cold rolling in Comparative Example 3, and the obtained samples were machined into a target shape. Vacuum heat treatment was not performed in other Comparative Examples.

As the surface machining method, as with the Examples, lathe was used for crude processing, and precision lathe was used for cutting work to obtain the same degree of surface roughness in one or two processes. Certain samples were subject to wet polishing or etching treatment after the cutting work. In other words, wet polishing was performed in Comparative Examples 1 to 3, and etching treatment was performed in Comparative Example 4 to remove the surface. In Comparative Examples 5 and 6, neither wet polishing nor etching treatment was performed.

Before sputtering, XRD measurement was conducted on a plane that is parallel with the target sputtered face at 9 locations in a cross shape. The burn-in time was calculated as the time until the deposition speed stabilized. The results are similarly shown in Table 1.

As shown in Examples 1 to 16 of Table 1, it is evident that the targets having FWHM (full width of half maximum) of the {200} crystal plane of tantalum of 0.1 to 0.6° have low integral power required for the burn-in, and the burn-in time has been significantly shortened.

In particular, as shown in Examples 1 to 5 and 7 to 13, targets having FWHM of the {200} crystal plane of tantalum of 0.15 to 0.45° are superior.

Further, as shown in Examples 1 to 4 and 7 to 10, it is evident that targets in which the variation of FWHM is within ±0.05° are stable and even more effective.

As shown in Examples 2, 3, 4, 6 and 7, it is evident that targets having FWHM of the {110} crystal plane of 0.25 to 0.4° and in which the variation of FWHM is within ±0.05° are preferable since they are able to shorten the burn-in time even more.

Further, Examples 1 to 10 show targets in which the depth of the processing strain of the tantalum sputtering target is a depth of 15 μm from the target surface.

Consequently, even though processing is performed with care, processing strain will exist within a range of 10 μm or less from the surface. Nevertheless, by performing vacuum heat treatment at a low temperature of around 100 to 250° C., an effect is yielded in that FWHM of {200} can be controlled stably and the burn-in time can be shortened.

Further, even in cases where a processing strain layer of roughly 20 μm exists, it has been discovered that the burn-in time can be effectively shortened.

Contrarily, with Comparative Example 1, Comparative Example 2, Comparative Example 5, and Comparative Example 6, since FWHM of the {200} crystal plane of tantalum exceeded 0.6°, it is evident that the integral power required for the burn-in increased, and the burn-in time increased proportionately.

Meanwhile, with Comparative Example 3 and Comparative Example 4, since FWHM of the {200} crystal plane of tantalum is less than 0.1, the generation of particles increased. Incidentally, in Comparative Example 3 and Comparative Example 4, vacuum heat treatment was performed at a high temperature of 800° C. in order to reduce the processing strain. Nevertheless, although improvement in the burn-in time was acknowledged, the level of particles contrarily became inferior.

Therefore, this shows that the reduction of FWHM of the {200} crystal plane of tantalum does not necessarily yield a favorable effect.

With Comparative Example 4, Comparative Example 5, and Comparative Example 6, FWHM of the {110} crystal plane of tantalum was adjusted to be within the range of the present invention. Nevertheless, since preference is given to FWHM of the {200} crystal plane, it is evident that controlling FWHM of the {200} crystal plane of tantalum is more important than adjusting FWHM of the {110} crystal plane.

The present invention yields superior effects of significantly reducing the initial burn-in time of a tantalum or a tantalum-based alloy sputtering target and minimizing the fluctuation in the deposition speed throughout the target life, whereby the production efficiency of semiconductors in the sputtering process can be improved and stabilized, and the production cost can be significantly reduced. Thus, the present invention is extremely useful as a tantalum or a tantalum-based alloy target.

It is obvious that the same effect is yielded in a tantalum-based alloy target having the same BCC structure. As the additive elements of this tantalum-based alloy target, high-melting metals such as Mo and 3- or 4-group elements can be considered, and platinum group metals such as platinum can be considered as other alloy elements. The additive amount should be an amount that does not significantly change the crystal structure.

The invention claimed is:

1. A tantalum or a tantalum-based alloy sputtering target having a metallurgical structure formed by casting, deformation processing including cold rolling as a final deformation process, and heat treatment including heat treatment after the cold rolling only at a temperature of 100 to 250° C. in a vacuum to control Full Width of Half Maximum (FWHM) of a {200} crystal plane measured by X-ray diffraction of an outermost surface of the sputtering target, wherein the FWHM of the {200} crystal plane measured by X-ray diffraction of the outermost surface of the sputtering target is 0.1 to 0.6°.

2. The sputtering target according to claim 1, wherein variation of FWHM of the {200} crystal plane is within ±0.05°.

3. The sputtering target according to claim 2, wherein FWHM of a {110} crystal plane is 0.25 to 0.4°, and the variation of FWHM of the {110} crystal plane is within ±0.05°.

4. The sputtering target according to claim 3, wherein a surface layer of the sputtering target contains strains arising from surface processing of said sputtering target, a depth of the surface layer containing the strains being 15 μm from the target surface.

5. The sputtering target according to claim 3, wherein a surface layer of the sputtering target contains strains arising from surface processing of said sputtering target, a depth of the surface layer containing the strains being 10 μm from the target surface.

6. The sputtering target according to claim 1, wherein FWHM of a {110} crystal plane is 0.25 to 0.4°, and variation of FWHM of the {110} crystal plane is within ±0.05°.

7. The sputtering target according to claim 6, wherein a surface layer of the sputtering target contains strains arising from surface processing of said sputtering target, a depth of the surface layer containing the strains being 15 μm from the target surface.

8. The sputtering target according to claim 6, wherein a surface layer of the sputtering target contains strains arising from surface processing of said sputtering target, a depth of the surface layer containing the strains being 10 μm from the target surface.

9. The sputtering target according to claim 1, wherein a surface layer of the sputtering target contains strains arising from surface processing of said sputtering target, a depth of the surface layer containing the strains being 15 μm or less from the target surface.

10. The sputtering target according to claim 1, wherein a surface layer of the sputtering target contains strains arising from surface processing of said sputtering target, a depth of the surface layer containing the strains being 10 μm or less from the target surface.

11. The sputtering target according to claim 1, wherein the FWHM of the {200} crystal plane measured by X-ray diffraction of the outermost surface of the sputtering target is 0.15 to 0.45°.

12. The sputtering target according to claim 11, wherein the variation of FWHM of the {200} crystal plane is within ±0.05°.

13. The sputtering target according to claim 12, wherein FWHM of a {110} crystal plane is 0.25 to 0.4°, and the variation of FWHM of the {110} crystal plane is within ±0.05°.

14. The sputtering target according to claim 13, wherein a surface layer of the sputtering target contains strains arising from surface processing of said sputtering target, a depth of the surface layer containing the strains being 15 μm from the target surface.

15. The sputtering target according to claim 13, wherein a surface layer of the sputtering target contains strains arising from surface processing of said sputtering target, a depth of the surface layer containing the strains being 10 μm from the target surface.

16. The sputtering target according to claim 1, wherein the sputtering target is a tantalum sputtering target.

* * * * *